April 23, 1963 I. C. SAVADELIS 3,087,100

OHMIC CONTACTS TO SEMICONDUCTOR DEVICES

Filed April 14, 1959

INVENTOR
I. C. SAVADELIS
BY H. W. Lockhart
ATTORNEY

United States Patent Office 3,087,100
Patented Apr. 23, 1963

3,087,100

OHMIC CONTACTS TO SEMICONDUCTOR DEVICES

Ignatius C. Savadelis, Allentown, Pa., assignor to Bell Telephone Laboratories, Incorporated, New York, N.Y., a corporation of New York Filed Apr. 14, 1959, Ser. No. 806,354
5 Claims. (Cl. 317—235)

Figure 1:
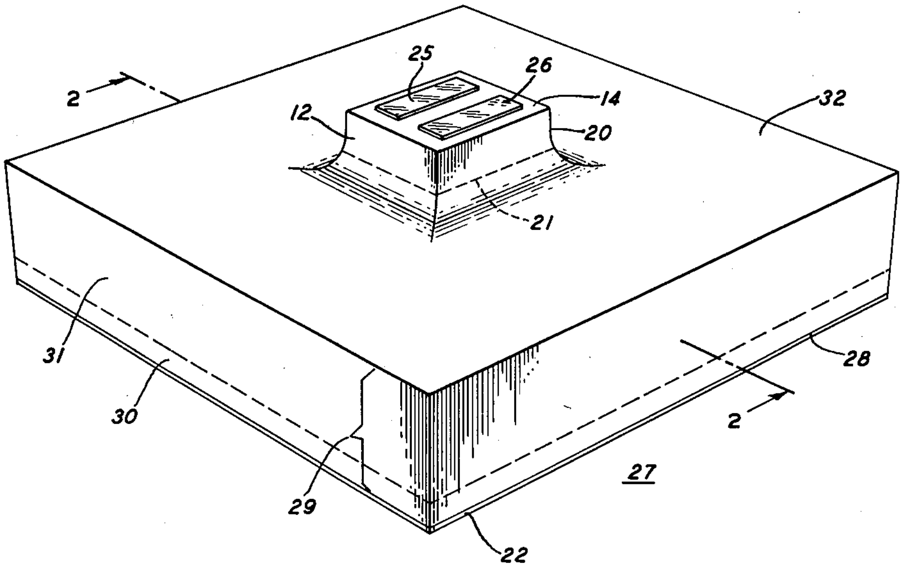

This invention relates to the fabrication of signal translating devices and, more particularly, to the fabrication of diffused base transistors of the type described in the copending application of G. C. Dacey, C. A. Lee and W. Shockley, Serial Number 496,202, filed March 23, 1955, now Patent No. 3,028,665, and assigned to the assignee of the present application.

One of the problems associated with P-N-P germanium diffused base transistors is the nature of the collector contact. It is found characteristic that alloyed contacts of moderate or high resistivity P-type germanium wafers inject electrons at high current densities. This leads to current gains in excess of unity at high current densities, which leads to instability in certain circuit applications.

Therefore, one object of this invention is an alloyed collector contact to P-type germanium which is non-injecting at high current densities.

In accordance with the prior art, indium has been employed as a medium for soldering the semiconductor wafer to the header. This inhibits the injection of minority carriers described above, but also impairs the reliability of the device, particularly when the device was used or aged at high ambient temperatures. Also, because the indium has a melting point of 155 degrees centigrade, the subsequent transistor processing temperatures have to be limited to below 150 degrees centrigrade. For example, this complicates the subsequent bonding of leads which is usually done at a higher temperature. One desirable method of bonding is the thermo-compression method which requires a temperature higher than 150 degrees centigrade in accordance with the teaching of the copending application of O. L. Anderson and H. Christensen, Serial Number 619,639, now Patent No. 3,006,067, assigned to the assignee of the present application.

Therefore, a broad object of this invention is to improve reliability of diffused base transistors.

Another object of this invention is a non-injecting collector contact to P-N-P diffused junction germanium transistors which is compatible with the other steps in the fabrication of these transistors.

The present invention is based on the discovery of certain advantages provided by limiting the lifetime of minority carriers in the area contiguous to the collector contact of transistors. A long minority carrier lifetime is usually considered essential to proper transistor action. However, this action is confined to the regions of the emitting and collecting junctions and the base region of the transistor. By introducing copper into a selected portion of the collector region of a P-N-P diffused base transistor in such a manner that the critical regions essential for proper transistor action are not affected, the applicant has produced a non-injecting substantially ohmic collector contact compatible with the other steps of the fabrication.

Copper is known to diffuse rapidly into germanium. It is also known to increase the rate of recombination of holes and electrons in single crystal P-type germanium. According to this invention, these properties of copper are utilized to provide non-injecting contacts to P-type germanium.

Therefore, in accordance with a specific feature of this invention, there is provided within the collector region of a P-N-P diffused base germanium transistor in proximity to the collector contact and at a distance greater than a few collector barrier thicknesses from the collector junction, a zone of copper rich germanium. A collector barrier thickness is typically less than $.4\times10^{-4}$ inches and is a measure of the distance over which a potential drop occurs when two materials of differing potentials are brought in contact.

Figure 2:
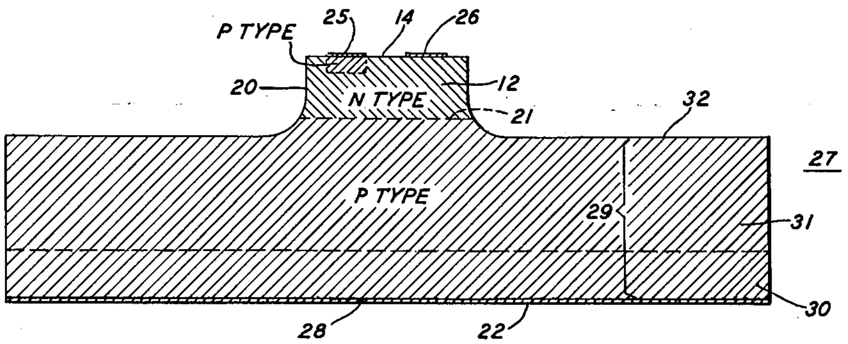

The invention and the above noted and other features thereof will be understood more clearly and fully from the following detailed description with reference to the accompanying drawing in which FIGURE 1 is a perspective view and FIGURE 2 is a cross-sectional view of a diffused base transistor incorporating the present invention. It will be understood that the figures are not necessarily to scale in order to better indicate the nature of the invention.

FIG. 1 is a perspective view of a P-N-P diffused base germanium transistor of the type disclosed in the aforementioned application of Dacey, Lee, Shockley modified in accordance with the present invention. The element 27 is approximately 0.050 inch square and 0.003 inch thick. The emitter and base electrodes 25 and 26, respectively, are rectangles, or stripes, each measuring 0.001 x 0.006 inch and separated by .0005 inch. The stripes are positioned on mesa 20 which is approximately .004 by .008 inch. The upper surface 14 of mesa 20 is about .001 inch above surface 32 of element 27. The diffused collector junction is exposed just below the edge of the mesa 20, as indicated by the dotted line 21. The chief purpose of the mesa is to minimize the area of this diffused collector junction 21, and hence collector capacity. The large area ohmic contact 22 is made to the entire surface 28 of the element 27. Thus the bulk of the wafer is a P-type collector region 29. Zone 30 is the copper rich portion of the collector region 29 wherein the lifetime of minority carriers effectively is about 0.001 microsecond and zone 31 is a portion of the collector region 29 which is substantially free of copper wherein the lifetime of minority carriers typically is greater than .1 microsecond. Zone 30 has a copper concentration of at least $10^{14}$ atoms/cm.$^3$; while zone 31 has been initially purified to an extent where the copper concentration is less than $10^{12}$ atoms/cm.$^3$.

FIG. 2 depicts a cross-sectional view of the diffused base transistor of FIG. 1. The emitter electrode 25 makes a rectifying contact with the base region 12 while base electrode 26 makes an ohmic contact. The base region 12 is germanium with a preponderance of an N-type impurity such as arsenic, phosphorus or antimony. The collector junction 21 is about $5\times10^{-4}$ inches distant from surface 14 and therefore, is part of the mesa 20 as indicated in FIG. 1. Collector region 29 is separated from the base region by collector junction 21 and consists of the two zones 30 and 31. As discussed above, zone 30 represents the copper rich germanium zone and is several collector barrier thicknesses distant from the collector junction 21 to avoid interference with proper transistor action. Zone 31 is substantially copper free and extends into region 29 for a distance equal to several collector barrier thicknesses from the collector junction 21. The collector electrode 22 makes contact to the transistor only through the copper diffused region 30. Therefore, any electrons injected by this electrode 22 will be blocked from reaching the collector junction by the copper diffused region 30 which acts as a low lifetime barrier to electrons.

A diffused base germanium transistor with a non-injecting collector contact has been fabricated in accordance with the following process: treat a surface of a P-type germanium wafer of one ohm cm. resistivity at an elevated temperature in an atmosphere of an N-type impurity such as arsenic, phosphorus and antimony. The impurity atoms enter the crystal and distribute themselves within it by the mechanism of solid state diffusion. Their concentration is greatest near the surface and diminishes toward the interior. This process produces the N-type base region and provides a collector junction approximately $5.0\times10^{-4}$ inches distant from the surface. If the water acquires an N-skin on the surface of the P-type collector region during diffusion, the surface may be etched in HF to remove the N-type skin and bonded to the header as described below. Alternatively, the N-type layer may be neutralized by gold bonding through the N-type layer directly to the header. Evaporate copper onto the surface of the P-type collector region most distant from the collector junction (simultaneous evaporation of 2–4% aluminum with the copper also produced desirable results). This evaporation is suitably accomplished in the following manner: place a clean .030 inch diameter copper wire in a tungsten evaporation filament of .035–.038 inch diameter; plate the filament into a vacuum chamber and evacuate to $2\times10^{-5}$ mm. of mercury; wet the copper to the evaporation filament by passing current through the filament until the copper melts and evaporate all the copper. This results in about a 1600 angstrom layer of copper on the germanium surface. A temperature of 550 degrees centigrade is maintained for about 10 seconds. This time limit should not be exceeded, otherwise the copper will diffuse beyond the limits intended for the zone 30, and further into the collector region. Such an extension of the copper diffused region tends to increase the reverse saturation current of the device. Apply an alloyed emitter electrode to the surface of the N-type region by evaporating a 1500 angstrom layer of aluminum onto a specific area by methods well known in the art. The aluminum advantageously may be evaporated onto the desired area before the copper is evaporated onto the surface of the P-type collector region. Then the application of 550 degrees centigrade for 10 seconds will accomplish both the alloying of the aluminum and the diffusion of the copper in one step. Apply a substantially ohmic base contact beside the emitter. Gold alloyed with a small percentage of antimony is vapor deposited to a thickness of about 2000 angstroms, and alloyed into the base region. Evaporate an alloy comprising 80% gold and 20% tin onto the above surface of the P-type collector region forming a layer approximately 3000 angstroms thick. This layer is then used as the medium in bonding the collector region to the header. The bonding temperature is approximately 325 degrees centigrade.

Although the invention has been explained in terms of the foregoing theory, the mechanism of operation is not completely understood. For example at 550 degrees centigrade the maximum copper concentration in germanium is $1.8\times10^{14}$ atoms/cm.$^3$. At twice this concentration theory predicts a lifetime of about 15 microseconds. However, a lifetime of less than .001 microsecond is necessary to account for the effect observed.

No effort has been made to exhaust the possible embodiments of the invention. It will be understood that the embodiment described is merely illustrative of the preferred form of the invention and various modifications may be made therein without departing from the scope and spirit of this invention.

For example, nickel and/or iron may be substituted for copper or copper with 2–4% aluminum with analogous results. When copper is used, however, its acceptor properties may also be utilized.

Furthermore, under certain circumstances, it may be desirable to accomplish the copper diffusion in a separate step. This is particularly so if a material other than aluminum is used to produce the emitter in which case an alloying temperature considerably above or below the ranges set forth hereinabove may be required.

It will be understood also that although the fabrication process is described in terms of a single wafer, the procedure may involve processing of an entire slice of semiconductor material as far as the diffusion and alloying steps before the slice is divided into a number of individual wafers.

What is claimed is:

1. A minority carrier diffused base germanium transistor of a P-N-P configuration comprising a germanium wafer including an emitter, a base and a collector region, the P-type collector region including two zones of which a first zone wherein the lifetime of minority carriers is greater than .1 microsecond is adjacent to the collector junction, and a second zone wherein the lifetime of minority carriers is of the order of 0.001 microsecond is several collector barrier thicknesses distant from said collector junction, and an electrode contacting said second zone.

2. A minority carrier diffused base germanium transistor of a P-N-P configuration comprising a germanium wafer including an emitter, a base and a collector region, the P-type collector region including two zones of which a first zone adjacent to the collector junction is substantially free of any impurity selected from the group consisting of copper, nickel, and iron, and a second zone several collector barrier thicknesses distant from said collector junction is rich in an impurity selected from the group consisting of copper, nickel, and iron, the ratio of minority carrier lifetimes between said impurity rich and impurity free zones being of the order of 1 to 100, and an electrode contacting said second zone.

3. A minority carrier diffused base germanium transistor of a P-N-P configuration comprising a germanium wafer including an emitter, a base and a collector region, the P-type collector region including two zones of which a first zone of P-type germanium adjacent to the collector junction has a copper concentration of less than $10^{12}$ atoms/cm.$^3$, and a second zone of P-type germanium several collector barrier thicknesses distant from said collector junction has a copper concentration of more than $10^{14}$ atoms/cm.$^3$, and an electrode contacting said second zone.

4. A device in accordance with the claim 2 wherein said electrode is composed of an alloy of about 80% gold and 20% tin.

5. A minority carrier germanium transistor comprising a P-type collector region including two zones of which a first zone adjacent to the collector junction is substantially free of copper, and a second zone several collector barrier thicknesses distant from said collector junction is copper rich the ratio of copper concentrations between said first and second zones being of the order of 1 to 100, an N-type skin on said second zone, and a collector contact gold bonded through said N-type skin to said second zone.

References Cited in the file of this patent

UNITED STATES PATENTS

| | | |
|---|---|---|
| 2,774,695 | Burton | Dec. 18, 1956 |
| 2,862,160 | Ross | Nov. 25, 1958 |
| 2,866,140 | Jones et al. | Dec. 23, 1958 |
| 2,878,147 | Beale | Mar. 17, 1959 |
| 2,879,188 | Strull | Mar. 24, 1959 |